US009484942B1

(12) United States Patent
Peschke

(10) Patent No.: US 9,484,942 B1
(45) Date of Patent: Nov. 1, 2016

(54) OSCILLOSCOPE WITH LOGIC ANALYZER FRONTEND

(71) Applicant: Rohde & Schwarz GmbH & Co. KG, Munich (DE)

(72) Inventor: Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/829,509

(22) Filed: Aug. 18, 2015

Related U.S. Application Data

(60) Provisional application No. 62/184,852, filed on Jun. 25, 2015.

(51) Int. Cl.
*H03M 1/06* (2006.01)
*H03M 1/18* (2006.01)

(52) U.S. Cl.
CPC ............ *H03M 1/0609* (2013.01); *H03M 1/188* (2013.01)

(58) Field of Classification Search
CPC ...... G01R 13/20; G01R 13/02; G01R 13/14; G01R 13/32; G01R 13/345; G01R 1/067; G01R 1/06; G01R 1/073; H03M 1/0609; H03M 1/188
USPC .......................... 345/501, 555; 341/110–155
See application file for complete search history.

(56) References Cited

U.S. PATENT DOCUMENTS

| | | | | |
|---|---|---|---|---|
| 5,446,650 A | * | 8/1995 | Overhage | G01R 13/345 324/121 R |
| 5,754,439 A | * | 5/1998 | Holcomb | G01R 13/345 324/121 R |
| 5,790,133 A | * | 8/1998 | Holcomb | G01R 13/20 345/501 |
| 5,942,982 A | * | 8/1999 | Noble | G01R 31/3181 324/500 |
| 6,798,843 B1 | * | 9/2004 | Wright | H03F 1/3241 330/149 |
| 7,116,121 B1 | * | 10/2006 | Holcombe | G01R 1/06772 324/754.07 |
| 2002/0145584 A1 | * | 10/2002 | Waterman | G09G 3/2011 345/98 |
| 2006/0115094 A1 | * | 6/2006 | Abe | H04R 3/02 381/66 |
| 2012/0119719 A1 | * | 5/2012 | Teh | H02M 3/1588 323/282 |

* cited by examiner

*Primary Examiner* — Lam T Mai
(74) *Attorney, Agent, or Firm* — Potomac Technology Law, LLC

(57) ABSTRACT

An electronic test apparatus, such as an oscilloscope, comprising a logic analyzer frontend, wherein the logic analyzer frontend comprises a digital input port configured to receive a digital signal from a device under test. The logic analyzer frontend further comprises at least one analog-to-digital converter that is arranged downstream of the digital input port, and a digital comparator that is arranged downstream of the analog-to-digital converter. The digital comparator is configured to generate an adjusted digital signal and to provide the adjusted digital signal to further components of the electronic test apparatus. The logic analyzer frontend further comprises a digital correction unit configured to adjust a digital decision threshold value of the comparator.

18 Claims, 7 Drawing Sheets

OSCILLOSCOPE WITH LOGIC ANALYZER FRONTEND

RELATED APPLICATIONS

This application claims the benefit of the earlier filing date under 35 U.S.C. §119(e) of U.S. Provisional Application Ser. No. 62/184,852 (filed 2015 Jun. 25).

FIELD OF THE INVENTION

Embodiments of the present invention relate to oscilloscopes that comprise a logic analyzer frontend, and more specifically to a mixed signal oscilloscope (MSO). MSOs combine the functionality of a digital storage oscilloscope with the functionality of a logic analyzer, with benefits that include the ability to view analog and digital signals together in time, and to trigger on either digital or analog signals and capture on the other. The digital input ports are used for applying at least one digital signal that is analyzed and evaluated in view of its logic characteristics.

BACKGROUND OF THE INVENTION

A classical logic analyzer is an electronic instrument that captures and displays multiple digital signals from a digital system or digital circuit, hereinafter referred to as device under test, short DUT. A logic analyzer may convert the captured data into timing diagrams, protocol decodes, state machine traces, assembly language, or may correlate assembly with source-level software. Logic analyzers have advanced triggering capabilities and are useful when a user needs to see the timing relationships between a plurality of digital signals generated by the DUT.

At the digital input ports of the MSO a distinct discretization unit is used for each specific digital input port to read the applied measured signal and to sample the value of the applied (digital) signal at that time point. Such a discretization unit might comprise an analog comparator that compares the (digital) input signal with a predefined threshold voltage value in order to decide whether a logic low-state or a logic high-state of the applied (digital) signal is received at the distinct digital input port. It should be noted that the discretization unit of a digital input port of an MSO cannot be compared to the precise and complex analog-to-digital conversion unit arranged at the analog input ports of the MSO to digitize an analog signal, since the MSO expects a digital input signal at the digital input port and thus there is no need to apply a full scale analog-to-digital conversion. Using such a discretization technique has the technical drawback that all amplitude information of the applied signal is lost.

U.S. Pat. No. 5,446,650 describes a better approach for a logic signal extraction with an oscilloscope. Therein, a digital input signal is first sampled as an analog signal to produce multi-bit digital samples that are representative of the amplitude of the input signal over time. The multi-bit digital samples are then processed using interpolative techniques to ascertain when the input signal crossed a hypothetical logic level threshold and when the signal is in a specific logic state.

Current oscilloscope/MSO approaches, however, still present drawbacks with regard to the distortion of the applied signal, and adjustment of a threshold level and compensation for MSO and probe-generated errors and losses.

What is needed, therefore, are approaches for oscilloscopes/MSOs that achieve further improvements in the measurement and analysis of an applied signal (i.e., digital signal) at a respective input port, such as improvements in the reduction in distortion of the applied signal, and in the adjustment of a threshold level and compensation for MSO and/or probe-generated errors and losses.

SUMMARY OF THE INVENTION

Embodiments of the present invention advantageously address the foregoing requirements and needs, as well as others, by providing a measurement system and related methods for testing multiple mobile phones in parallel, whereby, depending on the mobile standards used by the mobile phone, multiple parameter values for different parameters of a transmitted signal that is received by the mobile are measured, such that test throughputs are improved and associated costs are reduced.

According to a first aspect of the invention, an oscilloscope comprises a logic analyzer frontend, wherein the logic analyzer frontend comprises a digital input port for applying a digital signal. The logic analyzer frontend further comprises at least one analog-to-digital converter that is arranged downstream to the digital input port. A digital comparator is arranged downstream to the analog-to-digital converter, wherein the digital comparator provides an adjusted digital signal to subsequent modules of the oscilloscope. A digital correction unit is used in the logic analyzer frontend to adjust the digital comparator's decision threshold value. Further, subsequent modules of the oscilloscope may comprise a digital processing unit, an evaluation unit, a display unit and/or an error calculation unit, and the oscilloscope may further comprise analog input ports for applying analog signals to the oscilloscope. Using a digital comparator in connection with an analog-to-digital converter, for example, allows easier handling of the correction of the signal compared to analog converters.

By way of example, the logic analyzer frontend obtains at least a digital signal at a distinct digital input port. This applied signal has digital characteristics but is distorted by means of a DUT or a measurement probe or the input port of the oscilloscope. Thus, the applied digital signal is a superposition of digital values, generated by the DUT and noise signals that are generated by the DUT, the probe and/or the oscilloscope itself. For measurement and analysis of the digital signal, those added noise needs to be removed. Thus, the digital input port for applying a digital signal is treated like an analog input port but with less effort than applying an analog signal to an analog input port of the oscilloscope. For a proper evaluation and analyzation of this digital signal, a decision threshold value needs to be adjusted and misinterpreted logic states of the applied signal data need to be corrected before the analyzation of the signal starts. Thus, the inventive digital correction unit is used.

According to one embodiment, the digital correction unit is arranged downstream to the analog-to-digital converter to provide an adjustment signal to the digital comparator. Thus, the digital correction unit is placed in front of the digital comparator in order to adjust the digital comparator. Further, the digital correction unit may comprise a predefined parameter set in order to correct the applied digital signal in advance. In case a known DUT structure is analyzed, known distortion source can be compensated.

By way of example, the digital correction unit obtains a control signal that is fed back from the output of the digital comparator. Thus, the digital correction unit obtains a feedback control signal from the digital comparator that enables the digital correction unit to compare the output signal of the digital comparator with the applied digital signal. Thus, decision feedback equalization is achieved.

By way of further example, the digital correction unit compares an output signal of the analog-to-digital converter with the feedback control signal, wherein based on the comparison result, the threshold value of the digital comparator or a time-shift value is adjusted. Thus, the adjusted digital signal is time-aligned to the output of the analog-to-digital converter signal or the digital comparator's threshold value is aligned with a logic state of the applied digital signal. Preferably, an edge position or the voltage values of the signals are compared. Such a comparison may be adaptive. Thus, a comparison between the output of the analog-to-digital converter and the output of the digital comparator is repeated until a proper adjustment is obtained.

According to a further embodiment, the digital correction unit is a soft-decider unit or a decision feedback equalizer unit. By way of example, a decision feedback equalizer may be an adaptive equalizer routine for reducing errors comprising an adaptive filter that uses the feedback signal from the digital comparator in addition to conventional equalization of future symbols. Further, predefined training sequences to provide reference points for the adaptation process are used.

According to a further embodiment, a soft-decoder can be used to decode data that has been encoded with an error correcting code, whereas a hard-decider operates on data that take on a fixed set of possible values (e.g., logic low-state or logic high-state in a binary code), and the inputs to a soft-decider take on a whole range of values in-between. This extra information indicates the reliability of each input data point, and is used to form better estimates of the original data. Therefore, a soft-decision decoder will typically perform better in the presence of distorted signals and/or corrupted data than its hard-decision counterpart.

Thus, the evaluation of a bit stream concerning its congruousness is now possible at the early analyzer frontend of the oscilloscope and not at the subsequent processing unit of the oscilloscope. Thus, misinterpreted values can be corrected even before the analyzation of the signal starts. Using a soft-decider unit as the digital correction unit allows an analyzation of digital signals for instance by comparing the parity bit of a logical channel and/or by marking specific bits in a bit stream that have been evaluated as unclear whether they are in a first logic state or in a second logic state. Such soft-decider units are useful in case the history of digital signal transmission is needed for further evaluations.

By way of further example, the digital correction unit adjusts the threshold value of the digital comparator. Thus, the digital threshold unit comprises a variable threshold adjustment in order to obtain an adjustment signal to decide whether the threshold value is set up or set down from a predefined value.

According to a further embodiment, the logic analyzer frontend comprises a plurality of digital input ports, wherein each digital input port is connected to one dedicated analog-to-digital-converter. Thus, distinct analog-to-digital converters are arranged in parallel to operate a plurality of digital input signals, such as a bus input signal that comprises for instance two distinct bit lines, preferably eight distinct bit lines or more preferably 16 distinct bit lines. All signals are investigated in parallel and thus properly analyzed using the inventive oscilloscope.

By way of example, the bit resolution of the analog-to-digital converter is at least two bits, preferably four bits, more preferably eight bits or higher. Thus, a higher accuracy is achieved compared to logic channels that are normally used in digital oscilloscopes. Using the higher bit resolution in analog-to-digital converters allows avoiding analog comparators for sampling the applied signal and increases the accuracy.

According to a further embodiment, an analog evaluation unit for analog analyzation of the adjusted digital signal is arranged downstream to the digital comparator. The analog evaluation unit compares the adjusted digital signal with the digital signal from the digital input port for displaying purposes or for congruousness approval.

According to another aspect of the invention, an oscilloscope comprises a logic analyzer frontend that comprises a digital input port for applying a digital signal, at least one analog-to-digital converter that is arranged downstream to the digital input port and a digital comparator that is arranged downstream to the analog-to-digital converter, wherein the digital comparator provides an adjusted digital signal to subsequent modules in the oscilloscope. The logic analyzer frontend of the oscilloscope further comprises an offset unit that is arranged upstream to the analog-to-digital converter, wherein the offset unit reduces the voltage range of the applied digital signal. Thus, the analog-to-digital converter operates a signal with a voltage range that is smaller than the voltage range of the applied digital signal. Thus, the bit resolution of the analog-to-digital converter is now referred to a smaller voltage range and thus, the accuracy of the logic analyzer frontend is heavily increased.

By way of example, the offset unit provides an offset voltage to a first logic state voltage of the digital signal. Since a logic value is defined with a first logic state voltage and a second logic state voltage, the voltage range can be decreased if a first logic state voltage is increased. By way of further example, the offset unit provides a second offset voltage to a second logic state voltage of the digital signal. Thus, it is possible to decrease the voltage range and to observe the more critical voltages to the analog-to-digital converter and subsequently using the bit resolution of the analog-to-digital converter in a more efficient manner. By way of further example, the offset voltage level is adjusted by a digital correction unit that is arranged downstream to the analog-to-digital converter. By way of further example, the digital signal comprises a plurality of logic states, wherein the offset unit provides offset voltages to at least the lowest logic state and the highest logic state. A plurality of logic states is for instance obtained by using ternary signals or signals with more than three different logic states, represented with a respective number of dedicated voltage levels.

According to one embodiment, the logic analyzer frontend comprises a plurality of digital input ports, wherein each digital input port is connected to one dedicated analog-to-digital-converter. Thus, distinct analog-to-digital converters are arranged in parallel to operate a plurality of digital input signals, such as a bus input signal that comprises for instance two distinct bit lines, eight distinct bit lines or 16 distinct bit lines. All signals are investigated in parallel and thus are properly analyzed using the inventive oscilloscope.

According to a further aspect of the invention, an oscilloscope comprises a logic analyzer frontend that comprises a digital input port for applying a digital signal, at least one analog-to-digital converter that is arranged downstream to the digital input port and digital comparator that is arranged downstream to the analog-to-digital converter wherein the digital comparator provides an adjusted digital signal to subsequent modules in the oscilloscope. The logic analyzer frontend may further comprise a probe compensation unit that is arranged in between the digital input port and the analog-to-digital converter. The probe compensation unit is used to compensate a measurement probe and/or an impedance mismatch that is achieved by applying the digital signal from the DUT to the oscilloscope.

According to one embodiment, the probe compensation unit comprises a differential amplifier for adjusting an amplification of the digital signal. The adjustment of the amplification leads to an improved logic analyzer frontend and provides adjusted digital signals to subsequent modules of the oscilloscope.

According to a further embodiment, the oscilloscope comprises a probe compensation unit with a probe compensation element, wherein the probe compensation element comprises an impedance value that is equal to the impedance value of a probe to be compensated connected to the digital input port. Thus, an internal compensation of an impedance mismatch and/or a compensation of a measurement probe is achieved.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example only and not by way of any limitation in the figures of the accompanying drawings, in which like reference numerals refer to similar elements, and in which.

DETAILED DESCRIPTION OF THE PREFERRED EMBODIMENTS

Figure 1:
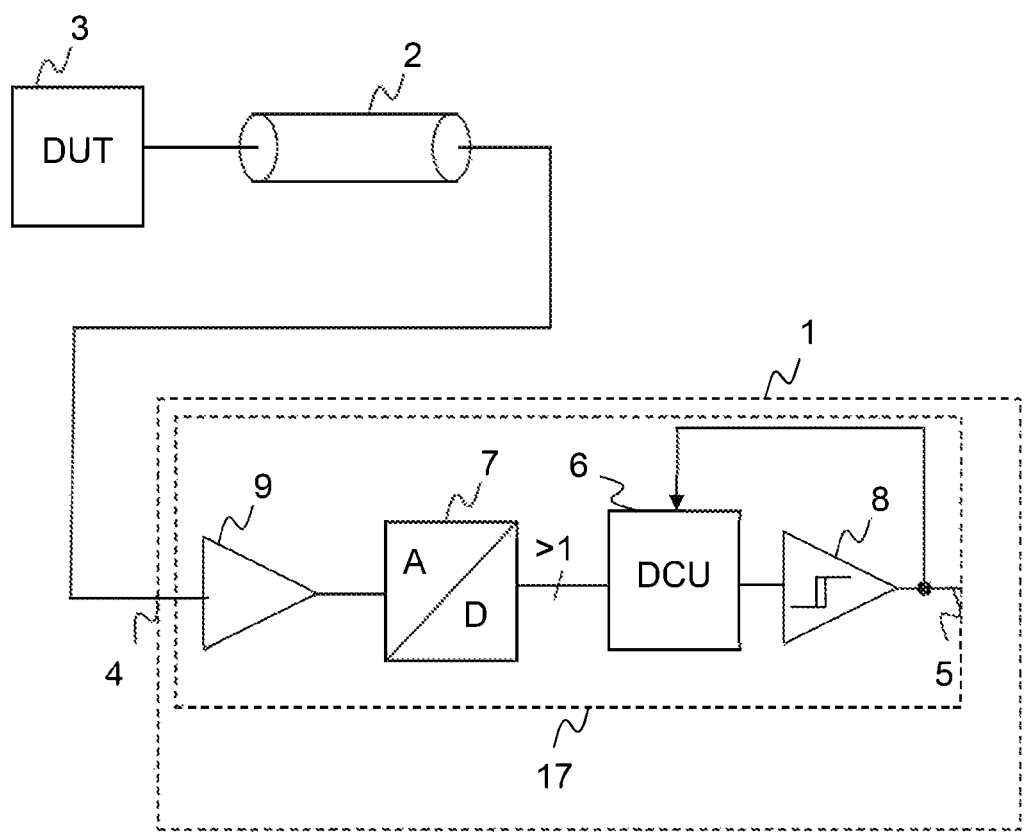
FIG. 1 illustrates a block diagram of a first example oscilloscope according to example embodiments.

FIG. 1 illustrates a block diagram of a first example oscilloscope according to example embodiments. The oscilloscope 1 is connected to a DUT 3 using a measurement probe 2. The oscilloscope 1 comprises at least a digital input port 4 on which a digital signal is applied that is generated by the DUT 3. The oscilloscope 1 is preferably an MSO. Thus, the oscilloscope 1 comprises a logic analyzer frontend 17 that comprises an input amplifier 9 for buffering the applied digital signal. Subsequent to the digital input port 4, an analog-to-digital converter 7, short ADC, is arranged in the signal path. The output of the ADC 7 comprises more than one signal lines to indicate that an ADC's bit resolution is higher than two bit, preferably four bit, more preferably eight bit.

The output of the ADC 7 is applied to a digital correction unit 6, short DCU. Subsequent to the DCU 6, a digital comparator 8 is arranged in the signal path. The output of the digital comparator 8 provides an adjusted digital signal 5 that is provided to subsequent modules (not shown) of the oscilloscope 1. More details about the subsequent modules of the oscilloscope 1 are obtained from the description of FIG. 7. The output signal of the digital comparator 8 is fed back to the DCU 6.

With the use of such an ADC 7 in combination with the DCU 6 and its feedback signal a correction of the frequency response of the test system that consists of the DUT 3, the measurement probe 2 and the input section of the oscilloscope 1 is achieved. The correction unit is a digital correction unit 6 in order to correct the frequency response of the analog measurement probes 2 in an efficient manner. Especially, the hysteresis of the digital comparator 8 can be chosen in a detailed manner. The hysteresis is independent from the signal frequency of the applied digital signal. Thus, the quality of the logic channels of a logic analyzer frontend 17 for high frequency is tremendously improved. Thus, higher bandwidths and higher measurement accuracy can be obtained for the logic analyzer frontend 17.

According to FIG. 1, decision feedback equalization, short DFE, is obtained. Thus, the DCU 6 is used in order to analyze the output signal of the digital comparator 8 on a bitwise manner. Thus, the bit error rate, short BER, of the output of the digital comparator 8 can be reduced. For instance, a time-alignment or a threshold-alignment of the digital comparator 8 can be achieved in an adaptive process. A distortion of the applied digital signal is thus reduced and the analyzation of the signal is faster and more efficient.

Figure 2:
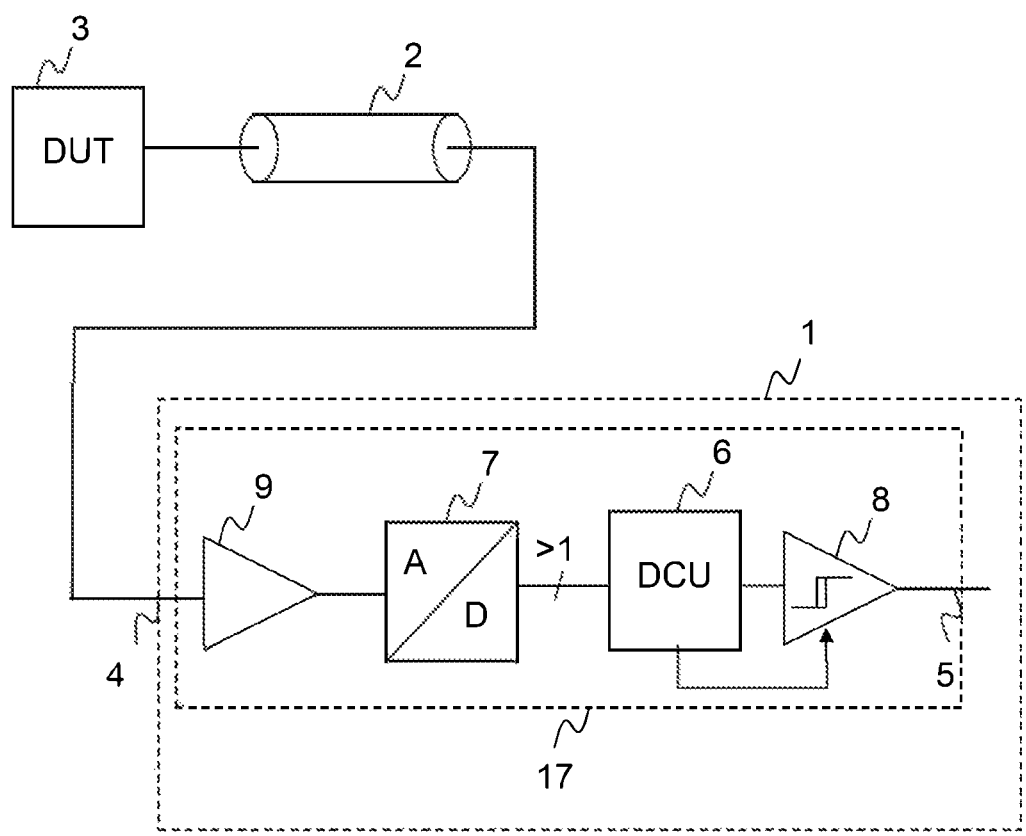
FIG. 2 illustrates a block diagram of a second example oscilloscope according to example embodiments.

FIG. 2 illustrates a block diagram of a second example oscilloscope according to example embodiments. In comparison to FIG. 1, the DCU 6 provides an adjustment signal to the digital comparator 8. The adjustment signal from the DCU 6 is a threshold adjustment signal in order to adjust a decision threshold value of the digital comparator 8. In case, the DCU 6 evaluates that the adjusted digital signal 5 can be further improved using a lower decision threshold value in the digital comparator 8, the adjustment signal provides appropriate commands or the desired threshold value to the digital comparator 8.

It should be noted that the embodiment according to FIG. 1 and the embodiment according to FIG. 2 can be combined. Thus, the feedback signal is used to provide the comparator's 8 output signal to the DCU 6 and subsequently to provide an adjustment signal to the DCU 6 based on a comparison in the DCU 6. Thus, an adaptive equalization is achieved to remove distortions or misinterpreted data values of the applied digital signal.

Figure 3:
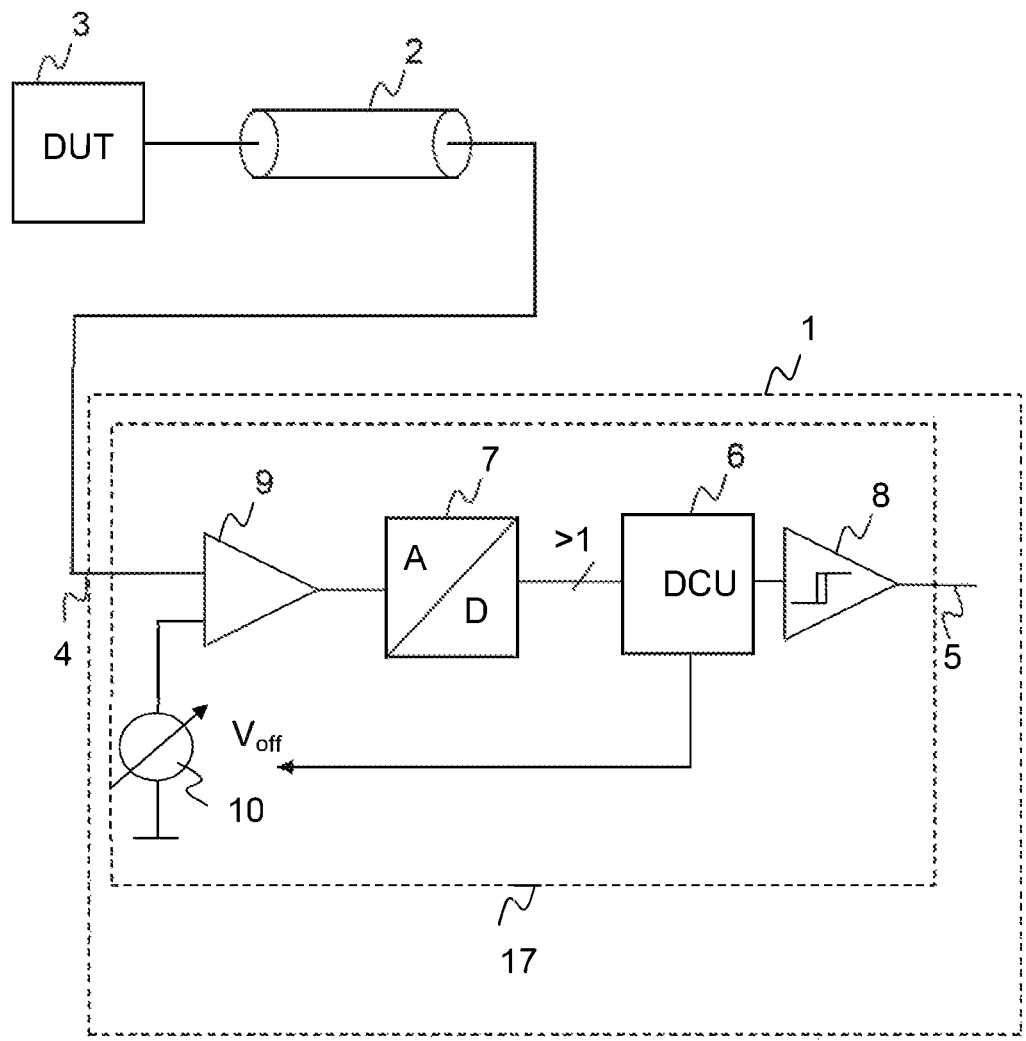
FIG. 3 illustrates a block diagram of a third example oscilloscope according to example embodiments.

FIG. 3 illustrates a block diagram of a third example oscilloscope according to example embodiments. Therein, the input amplifier 9 is provided with an offset voltage unit 10 that provides an offset voltage value Voff. The offset voltage unit 10 adjusts a voltage range of the digital signal that is applied to the ADC 7. For instance, if the voltage range of the digital signal at the digital input 4 comprises a voltage range from approximately 0 Volts to 2 Volts, a four bit ADC 7 provides its bit resolution to approximately 2 Volts. Assuming, that the distortion of the applied signal is above approximately 1.5 Volts, the bit resolution would be wasted to unimportant regions of the voltage range. To avoid such a deficiency, the logic low-range of the digital signal at the digital input 4 is adjusted to approximately 1.5 Volts instead of 0 Volts by means of the offset voltage unit 10. Thus, the ADC 7 obtains a signal within a voltage range of approximately 1.5 Volts to 2 Volts. Thus, the four bit ADC 7 provides its bit resolution to a voltage range of only approximately 0.5 Volts. Thus, the digital comparator 8 can operate in higher accuracy and the bit resolution of the ADC 7 is used for a critical voltage range only.

The digital input signal 4 can be a binary signal or a multi-level signal. In case a multi-level signal is applied to the digital input port 4, at least the lowest logic state and the highest logic state of the digital signal are adjusted using the offset voltage unit 10.

Figure 4:
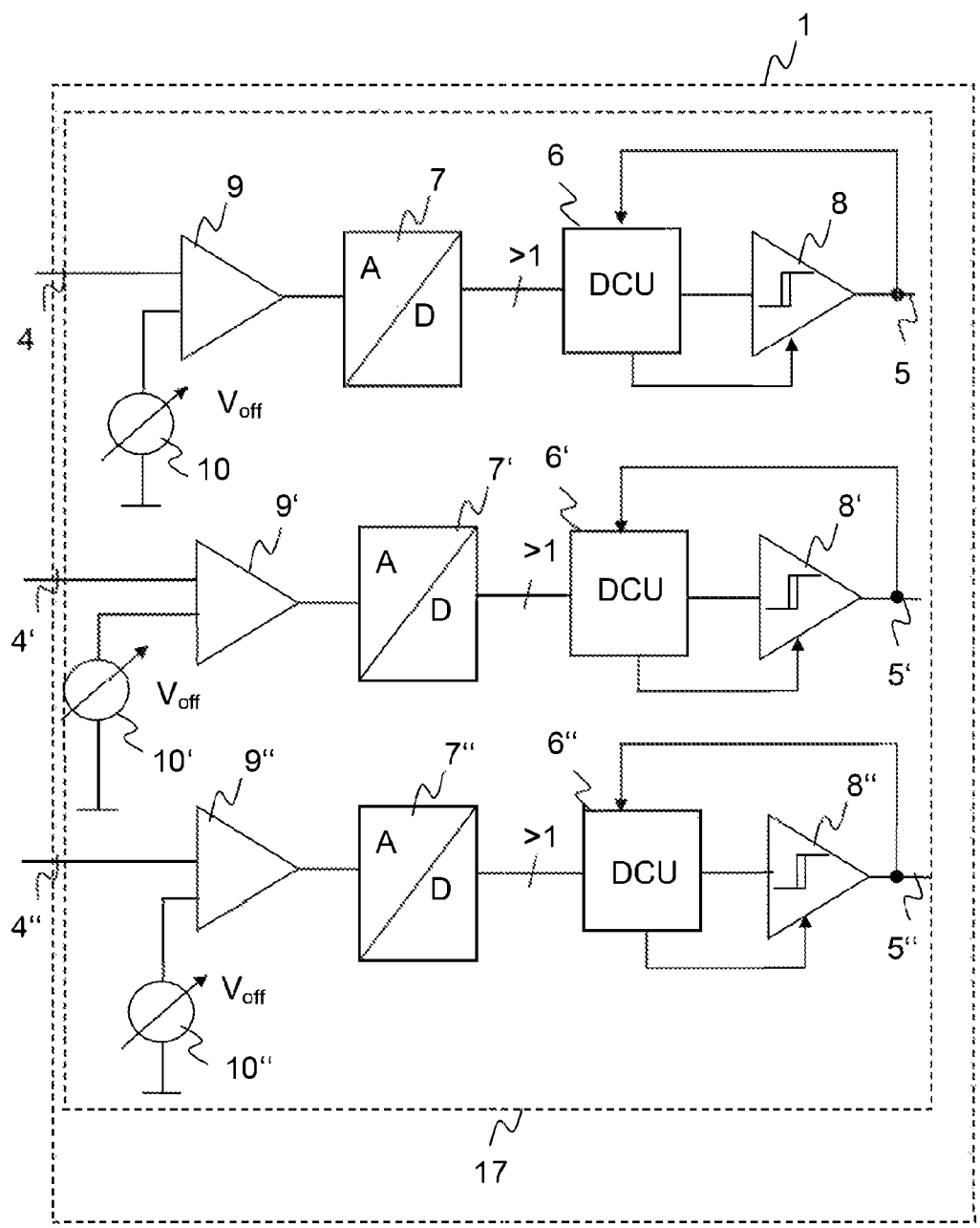
FIG. 4 illustrates a block diagram of a fourth example oscilloscope according to example embodiments.

FIG. 4 illustrates a block diagram of a fourth example oscilloscope according to example embodiments. In contrast to the previous embodiments, three distinct digital input ports 4, 4', 4" are shown. Three distinct logic channels of the MSO 1 thus provide adjusted digital signals 5, 5', 5" at their respective outputs. Each logic channel comprises a distinct input amplifier 9, 9', 9", an offset voltage unit 10, 10', 10", an ADC 7, 7', 7", a DCU 6, 6', 6" and a digital comparator 9, 9', 9". The adjusted digital signal 5, 5', 5" is fed back to the respective DCU 6, 6', 6". The DCU 6, 6', 6" also provides a respective adjustment signal to the respective digital comparator 8, 8', 8". Thus, the logic analyzer frontend 17 of the oscilloscope 1 comprises three identical logic channels for applying three independent digital input signals at three independent input ports 4, 4', 4" and/or for applying a digital input signal with three bit-lines.

The number of digital channels for such an analyzer frontend 17 is not limited to three and it should be noted that any number of channels is within the scope of the invention. Since the logic channels are adjusted and arranged in parallel, they are independent from each other and provide adjusted digital signals 5, 5', 5".

Figure 5:
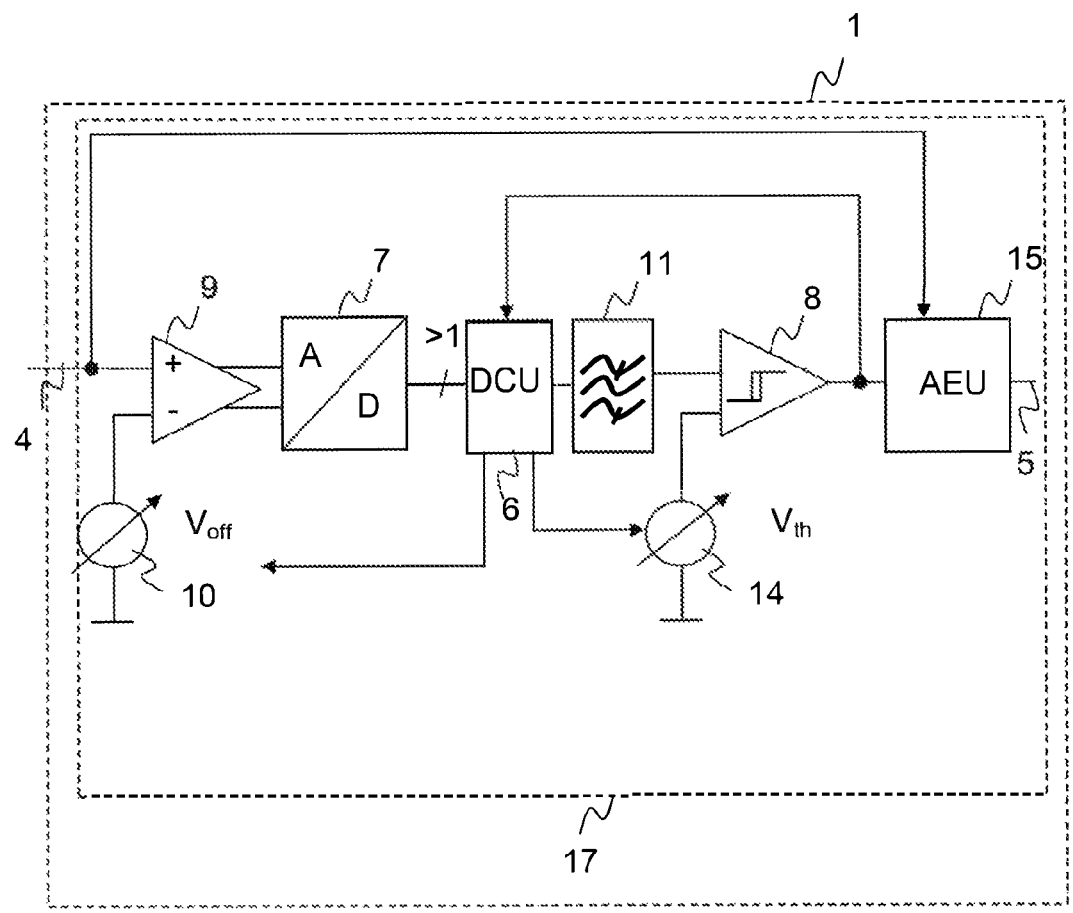
FIG. 5 illustrates a block diagram of a fifth example oscilloscope according to example embodiments.

FIG. 5 illustrates a block diagram of a fifth example oscilloscope according to example embodiments. Therein, a digital filter 11 is arranged in between the DCU 6 and the digital comparator 8. Since a feedback signal from the output of the digital comparator 8 is fed back to the DCU 6, the filter 11 is implemented as an adaptive filter. The digital comparator 8 comprises a second input that is applied to a hysteresis adjustment unit 14. The hysteresis adjustment unit 14 is controlled by an adjustment signal derived from the DCU 6. The DCU 6, the digital filter 11 and the digital comparator 8 in comparison with the hysteresis adjustment unit 14 build an adaptive equalizer or a DFE with an adaptive filtering measure. Thus, the DCU 6 is adjusted with a feedback loop and a digital filter 11.

By way of example, the DCU 6 is preloaded with a set of adjustment filter parameters to fasten the adjustment process. The digital filter 11 is a finite-impulse-response filter 11 or an infinite-impulse-response filter 11. A finite impulse response filter is a filter whose impulse response or response to any finite length input is of finite duration, because it settles to zero in finite time. This is in contrast to infinite impulse response filters, which may have internal feedback and may continue to respond indefinitely. Furthermore, the DCU 6 provides the offset value Voff to the offset voltage unit 10.

Subsequent to the digital comparator 8, an analog evaluation unit 15, short AEU, is inserted that compares the output signal derived from the digital comparator 8 with the digital input signal 4. Thus, the logic analyzer frontend 17 can compare the digitally derived values with the input signal in order to evaluate the correctness of the correction loop consisting of the DCU 6, the filter 11, the comparator 8 and the hysteresis adjustment 14. Thus, a congruousness of the digital signal can be approved.

Figure 6:
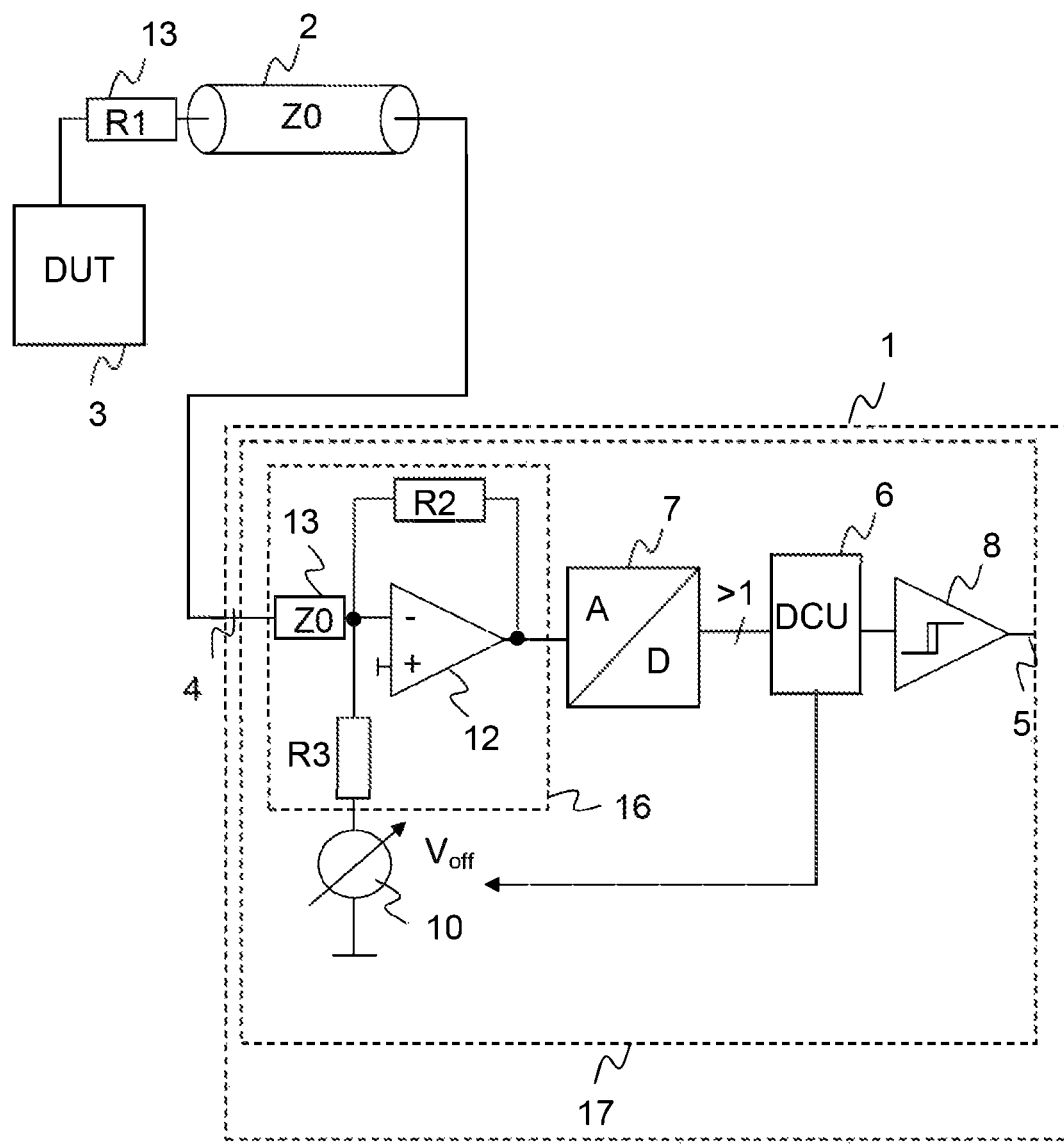
FIG. 6 illustrates a block diagram of a sixth example oscilloscope according to example embodiments.

FIG. 6 illustrates a block diagram of a sixth example oscilloscope according to example embodiments. Therein, a probe compensation unit 16 is shown (dotted lines) that is inserted between the digital input port 4 and the ADC 7. The probe compensation unit 16 comprises a compensation element 13. The compensation element 13 comprises an impedance value Z0 that is equal to an impedance value Z0 of the measurement probe 2. Furthermore, a differential amplification 12 is shown, wherein the differential amplifier 12 comprises a feedback loop consisting of a resistor R2. The resistor R2 is further connected to a series connection of a resistor R3 and a voltage offset unit 10. Thus, the probe compensation unit 16 comprises a compensation adjustment value 13 and a differential amplification with an adjustable amplification.

Using such a probe compensation unit 16, the measurement probe 2 is terminated to all frequencies in an impedance-corrected manner. The amplification of the differential amplifier 12 is obtained by a value V=−R2/(R1+Z0). The offset voltage Voff of the offset voltage unit 10 is calculated by Voff R1/R3.

Figure 7:
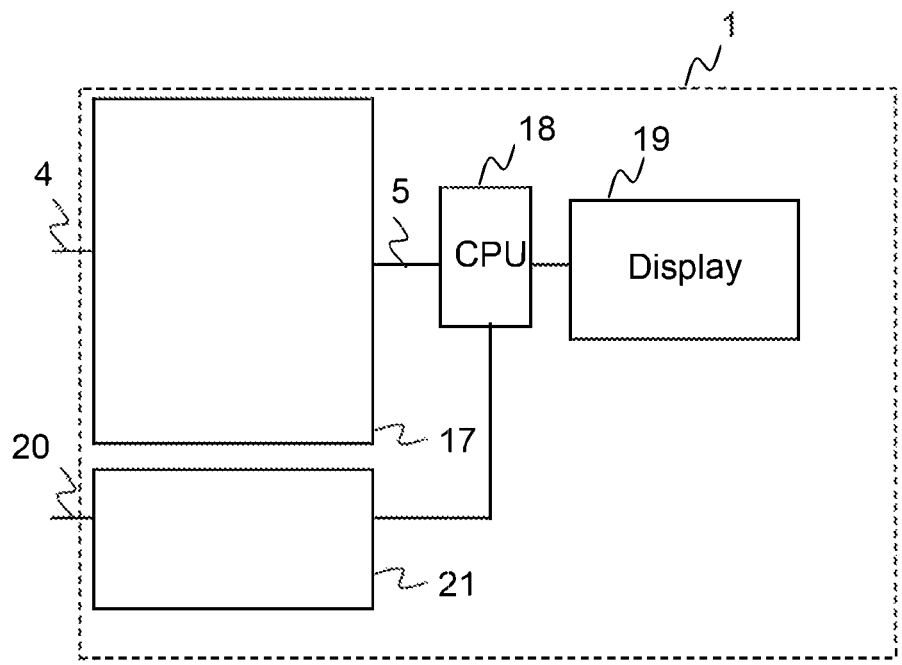
FIG. 7 illustrates a block diagram of a seventh example oscilloscope according to example embodiments.

FIG. 7 illustrates a block diagram of a seventh example oscilloscope according to example embodiments. Therein, the digital input port 4 is connected to a logic analyzer frontend 17 to provide an adjusted digital signal 5 as previously described. The adjusted digital signal 5 is applied to a central processing unit 18, short CPU. The output of the CPU 18 is provided to a display unit 19. Independent from the digital input port 4, an analog input port 20 is shown. The analog input port 20 is provided to an analog frontend 21. The analog frontend 21 applies a digitized signal to the CPU 18 independent from the logic analyzer frontend 17. Thus, an MSO 1 is obtained that can provide data evaluation of analog signals and digital signals with high accuracy.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalences.

Although the invention has been illustrated and described with respect to one or more implementations, equivalent alterations and modifications will occur to those skilled in the art upon the reading and understanding of the specification and the annexed drawings. In addition, while a particular feature of the invention may have been disclosed with respect to only one of the several implementations, such feature may be combined with one or more other features of the other implementations as may be desired and advantage for any given or particular application.

What is claimed is:

1. An electronic test apparatus comprising:
  a digital input port configured to receive a digital signal;
  at least one analog-to-digital converter (ADC) arranged downstream of the digital input port, wherein the ADC is configured to sample the digital signal to generate multi-bit digital samples representative of amplitudes of the digital signal over time;

a digital comparator arranged downstream of the analog-to-digital converter, wherein the digital comparator is configured to generate an adjusted digital signal; and a digital correction unit configured to receive the adjusted digital signal from the digital comparator as a feedback signal, and to adjust a digital decision threshold value of the comparator based on the feedback signal.

2. The electronic test apparatus according to claim 1, wherein the digital correction unit is arranged downstream of the analog-to-digital converter and is configured to generate and provide an adjustment signal to the digital comparator.

3. The electronic test apparatus according to claim 1, wherein the digital correction unit is configured to obtain a control signal that is fed back from an output of the digital comparator.

4. The electronic test apparatus according to claim 3, wherein the digital correction unit is configured to compare an output signal of the analog-to-digital converter with the control signal, wherein the digital comparator is adjusted based on the comparison result.

5. The electronic test apparatus according to claim 1, wherein the digital correction unit comprises a digital filter configured to provide an adaptive filtering structure.

6. The electronic test apparatus according to claim 1, wherein the digital correction unit comprises one of a soft decision processor and a decision feedback equalizer.

7. The electronic test apparatus according to claim 1, further comprising:
a plurality of digital input ports, each configured to receive a respective digital signal; and
a plurality of analog-to-digital converters,
wherein each digital input port is connected to a respective analog-to-digital-converter, and
wherein each analog-to-digital-converter is configured to sample the respective digital signal to generate multi-bit digital samples representative of amplitudes of the digital signal over time.

8. The electronic test apparatus according to claim 1, wherein a bit resolution of the analog-to-digital converter is at least two bits.

9. The electronic test apparatus according to claim 1, further comprising an analog processor arranged downstream of the digital comparator, wherein the analog processor is configured to analyze the adjusted digital signal.

10. An electronic test apparatus comprising:
a digital input port configured to receive a digital signal;
at least one analog-to-digital converter arranged downstream of the digital input port;
a digital comparator arranged downstream of the analog-to-digital converter, wherein the digital comparator is configured to generate an adjusted digital signal; and
an offset unit arranged upstream of the analog-to-digital converter, wherein the offset unit is configured to reduce a voltage range of the digital signal via one or more offset voltages.

11. The electronic test apparatus according to claim 10, wherein the offset unit is configured to apply a first offset voltage to a first logic state voltage of the digital signal.

12. The electronic test apparatus according to claim 11, wherein the offset unit is further configured to apply a second offset voltage to a second logic state voltage of the digital signal.

13. The electronic test apparatus according to claim 10, further comprising:
a digital processor arranged downstream of the analog-to-digital converter, wherein the digital processor is configured to adjust the offset voltages.

14. The electronic test apparatus according to claim 10, wherein the digital signal comprises a plurality of logic states, and wherein the offset unit is configured to apply an offset voltage to at least each of a lowest logic state and a highest logic state of the digital signal.

15. The electronic test apparatus according to claim 10, further comprising:
a plurality of digital input ports, wherein each digital input port is connected to a respective analog-to-digital-converter.

16. An electronic test apparatus comprising:
a digital input port configured to receive a digital signal;
at least one analog-to-digital converter arranged downstream of the digital input port;
a digital comparator arranged downstream of the analog-to-digital converter, wherein the digital comparator is configured to generate an adjusted digital signal; and
a probe compensator arranged between the digital input port and the analog-to-digital converter.

17. The electronic test apparatus according to claim 16, wherein the probe compensator includes a differential amplifier configured to adjust an amplification of the digital signal.

18. The electronic test apparatus according to claim 16, wherein the probe compensator is configured to compensate for an impedance value a probe connected to the digital input port.

* * * * *